US008637150B2

(12) United States Patent
Hayes et al.

(10) Patent No.: US 8,637,150 B2
(45) Date of Patent: Jan. 28, 2014

(54) MULTILAYER ACID TERPOLYMER ENCAPSULANT LAYERS AND INTERLAYERS AND LAMINATES THEREFROM

(75) Inventors: Richard Allen Hayes, Beaumont, TX (US); Jane Kapur, Kennett Square, PA (US); Sam Louis Samuels, Landenberg, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 96 days.

(21) Appl. No.: 11/865,391

(22) Filed: Oct. 1, 2007

(65) Prior Publication Data

US 2009/0084424 A1  Apr. 2, 2009

(51) Int. Cl.
*B32B 27/00* (2006.01)
*H01L 31/04* (2006.01)
*H01L 31/18* (2006.01)

(52) U.S. Cl.
USPC ........ 428/339; 428/419; 428/423.1; 428/220; 428/483; 428/442

(58) Field of Classification Search
USPC ........... 428/339, 412, 419, 423.1, 442, 476.3, 428/483, 516, 522; 136/244; 156/60
See application file for complete search history.

(56) References Cited

U.S. PATENT DOCUMENTS

| | | | | | |
|---|---|---|---|---|---|
| 3,404,134 | A | * | 10/1968 | Rees | 525/362 |
| 3,681,179 | A | * | 8/1972 | Theissen | 428/336 |
| 3,762,988 | A | | 10/1973 | Clock et al. | |
| 3,957,537 | A | * | 5/1976 | Baskett et al. | 136/251 |
| 4,663,228 | A | * | 5/1987 | Bolton et al. | 428/334 |
| 5,508,205 | A | | 4/1996 | Dominguez et al. | |
| 6,096,148 | A | * | 8/2000 | Kingma | 156/107 |
| 6,187,448 | B1 | * | 2/2001 | Hanoka et al. | 428/515 |
| 6,217,982 | B1 | | 4/2001 | Dawson | |
| 6,320,116 | B1 | | 11/2001 | Hanoka | |
| 6,414,236 | B1 | * | 7/2002 | Kataoka et al. | 136/251 |
| 6,432,522 | B1 | * | 8/2002 | Friedman et al. | 428/212 |
| 6,586,271 | B2 | | 7/2003 | Hanoka | |
| 6,693,237 | B2 | | 2/2004 | Yamada et al. | |
| 6,777,610 | B2 | | 8/2004 | Yamada et al. | |
| 2001/0008695 | A1 | | 7/2001 | Bolton et al. | |
| 2003/0152791 | A1 | | 8/2003 | Lu | |
| 2004/0144415 | A1 | | 7/2004 | Arhart | |
| 2004/0161623 | A1 | | 8/2004 | Domine et al. | |
| 2004/0191422 | A1 | | 9/2004 | Kataoka et al. | |
| 2005/0256268 | A1 | | 11/2005 | Chen | |
| 2005/0279401 | A1 | * | 12/2005 | Arhart et al. | 136/251 |
| 2006/0057392 | A1 | * | 3/2006 | Smillie et al. | 428/421 |
| 2006/0084763 | A1 | | 4/2006 | Arhart et al. | |
| 2006/0165929 | A1 | * | 7/2006 | Lenges et al. | 428/35.7 |
| 2006/0207645 | A1 | | 9/2006 | Wada | |
| 2007/0048519 | A1 | * | 3/2007 | Anderson et al. | 428/323 |
| 2007/0154694 | A1 | | 7/2007 | Samuels et al. | |
| 2007/0221268 | A1 | | 9/2007 | Hasch | |
| 2008/0017241 | A1 | | 1/2008 | Anderson et al. | |
| 2008/0023063 | A1 | | 1/2008 | Hayes et al. | |
| 2008/0023064 | A1 | | 1/2008 | Hayes et al. | |
| 2008/0053516 | A1 | | 3/2008 | Hayes | |
| 2008/0099064 | A1 | | 5/2008 | Hayes | |
| 2008/0128018 | A1 | | 6/2008 | Hayes | |
| 2008/0185035 | A1 | | 8/2008 | Hayes | |
| 2008/0190481 | A1 | | 8/2008 | Hayes et al. | |
| 2009/0023867 | A1 | | 1/2009 | Nishijima et al. | |
| 2009/0120489 | A1 | | 5/2009 | Nishijima et al. | |
| 2009/0126781 | A1 | | 5/2009 | Hayes et al. | |
| 2009/0151772 | A1 | | 6/2009 | Hayes et al. | |
| 2009/0151773 | A1 | | 6/2009 | Hayes et al. | |
| 2010/0275978 | A1 | | 11/2010 | Hayes et al. | |
| 2011/0297231 | A1 | | 12/2011 | Hayes et al. | |
| 2011/0297232 | A1 | | 12/2011 | Hayes et al. | |
| 2011/0297233 | A1 | | 12/2011 | Hayes et al. | |

FOREIGN PATENT DOCUMENTS

| | | |
|---|---|---|
| EP | 1544921 A1 | 6/2005 |
| JP | 06-322334 A | 11/1994 |
| JP | 08-316508 A | 11/1996 |
| JP | 11-026791 A | 1/1999 |
| JP | 2000-186114 A | 7/2000 |
| JP | 2000186114 | 7/2000 |
| JP | 2001-089616 A | 4/2001 |
| JP | 2001-094135 A | 4/2001 |
| JP | 2001-119047 A | 4/2001 |
| JP | 2001-119056 A | 4/2001 |
| JP | 2001-119057 A | 4/2001 |
| JP | 2001089616 | 4/2001 |
| JP | 2001119047 | 4/2001 |
| JP | 2001119056 | 4/2001 |
| JP | 2001119057 | 4/2001 |
| JP | 2001144313 | 5/2001 |
| JP | 2001144313 A | 5/2001 |

(Continued)

OTHER PUBLICATIONS

Surlyn 8920 data sheet, Du Pont, whole document, Jan. 2010, no author available.*
Surlyn 8140 data sheet, Du Pont, whole document, Jan. 2010—no author available.*
U.S. Appl. No. 12/012,891, filed Feb. 6, 2008, Inventors: Richard Allen Hayes and Sam Louis Samuels.
U.S. Appl. No. 12/012,843, filed Feb. 6, 2008, Inventors Richard Allen Hayes and Sam Louis Samuels.
U.S. Appl. No. 11/796,858, filed Apr. 30, 2007, Inventor: Richard Allen Hayes.
DuPont™ Surlyn® 1857 Zinc Ionomer Resin for Blown and Cast Film, http://www.matweb.com.

(Continued)

*Primary Examiner* — David Sample
*Assistant Examiner* — Tahseen N Khan
(74) *Attorney, Agent, or Firm* — Maria M. Kourtakis; Kelly Law Registry

(57) ABSTRACT

The present invention provides an acid terpolymer comprising multilayer film or sheet and safety laminates and solar cell pre-lamination assemblies comprising the same.

26 Claims, No Drawings

(56) References Cited

FOREIGN PATENT DOCUMENTS

| | | |
|---|---|---|
| JP | 2001261904 | 9/2001 |
| JP | 2001-326374 A | 11/2001 |
| JP | 2001332751 | 11/2001 |
| JP | 2002335005 | 11/2002 |
| JP | 2004-031445 A | 1/2004 |
| JP | 2004031445 | 1/2004 |
| JP | 2004058583 | 2/2004 |
| JP | 2005-034913 | 2/2005 |
| JP | 2005-064266 | 3/2005 |
| JP | 2005-064268 | 3/2005 |
| JP | 2006-032308 A | 2/2006 |
| JP | 2006-036874 A | 2/2006 |
| JP | 2006-036875 A | 2/2006 |
| JP | 2006-036876 A | 2/2006 |
| JP | 2006032308 | 2/2006 |
| JP | 2006036875 | 2/2006 |
| JP | 2006-186233 A | 7/2006 |
| JP | 2006-186237 A | 7/2006 |
| JP | 2006-190865 A | 7/2006 |
| JP | 2006-190867 A | 7/2006 |
| JP | 2006190867 | 7/2006 |
| WO | 99/04971 | 2/1999 |
| WO | 02/078953 A1 | 10/2002 |
| WO | 03/041177 A1 | 5/2003 |
| WO | 2006/095762 A1 | 9/2006 |
| WO | 2007/079091 A1 | 7/2007 |
| WO | 2008/078366 A1 | 1/2009 |
| WO | 2008/078366 A2 | 1/2009 |

OTHER PUBLICATIONS

DuPont™ Surlyn® 1857, Surlyn Resins Product Data Sheet (2007).
DuPont™ Surlyn® 1857 Material Safety Data Sheet (Jul. 27, 2005 Revision).
DuPont™ Surlyn® 1857 Grade Comparison Chart (2005).
PCT International Search Report for International application No. PCT/US2008/078366, dated Jan. 13, 2009.
PCT International Written Opinion for International application No. PCT/US2008/078366, dated Jan. 13, 2009.
Amendment dated Mar. 28, 2012 for U.S. Appl. No. 13/212,535 (US2011-0297231A1).

* cited by examiner

MULTILAYER ACID TERPOLYMER ENCAPSULANT LAYERS AND INTERLAYERS AND LAMINATES THEREFROM

The present invention relates to a multilayer film or sheet comprising an acid terpolymer and a safety glass laminate or solar cell laminate comprising the same.

BACKGROUND OF THE INVENTION

Glass laminated products, such as safety glass, have contributed to society for almost a century. Safety glass also found uses in structural, decorative or other architectural applications.

Safety glass typically consists of a sandwich of two glass sheets or panels bonded together with a polymeric interlayer of a polymeric sheet. One or both of the glass sheets may be replaced with optically clear rigid polymeric sheets, such as sheets of polycarbonate materials. Safety glass has further evolved to include multiple layers of glass and/or rigid polymeric sheets bonded together with interlayers.

The interlayer is typically made with a relatively thick polymer sheet, which exhibits toughness and bondability to provide adhesion to the glass in the event of a crack or crash. Widely used interlayer materials include complex, multicomponent compositions based on poly(vinyl butyral) (PVB), poly(urethane) (PU), poly(ethylene-co-vinyl acetate) (EVA), and the like.

As a renewable energy resource, the use of solar cell modules is rapidly expanding. One preferred way of manufacturing a solar cell module involves forming a pre-lamination assembly comprising at least 5 structural layers. The solar cell pre-lamination assemblies are constructed in the following order starting from the top, or incident layer (that is, the layer first contacted by light) and continuing to the backing layer (the layer furthest removed from the incident layer): (1) incident layer (typically a glass plate or a thin polymeric film (such as a fluoropolymer or polyester film), but could conceivably be any material that is transparent to sunlight), (2) front encapsulant layer, (3) solar cell component, (4) back encapsulant layer, and (5) backing layer.

The encapsulant layers are designed to encapsulate and protect the fragile solar cell component. Generally, a solar cell pre-lamination assembly incorporates at least two encapsulant layers sandwiched around the solar cell component. The optical properties of the front encapsulant layer may be such that light can be effectively transmitted to the solar cell component. Additionally, encapsulant layers generally have similar requirements and compositions to that described above for safety glass interlayers.

The use of acid copolymers of α-olefins and α,β-ethylenically unsaturated carboxylic acids in forming safety glass interlayers has been known within the art (see, e.g., U.S. Pat. No. 3,762,988). The use of such acid copolymers in forming solar cell encapsulant layers has been disclosed in, e.g., U.S. Pat. Nos. 5,508,205; 6,187,448; 6,320,116; 6,414,236; 6,586,271; 6,693,237; and 6,777,610, U.S. Pat Appl Nos. 2004/0191422 and 2006/0207645; European Pat No. 1 544 921; Japanese Pat Nos. JP 2000186114; JP 2001089616; JP 2001119047; JP 2001119056; JP 2001119057; JP 2001144313; JP 2001261904; JP 2001332751; and JP 2002335005; JP 2004031445; JP 2004058583; JP 2006032308; JP 2006036875; and JP 2006190867, and PCT Pat Appl No. WO 03/041177).

Acid terpolymers of α-olefins, α,β-ethylenically unsaturated carboxylic acids, and α,β-ethylenically unsaturated carboxylic acid esters have also been used in forming safety glass interlayers (see e.g., U.S. Pat Appl No. 2001/0008695) or solar cell encapsulant layers (see e.g., U.S. Pat. Nos. 3,957,537 and 6,414,236, and Japanese Pat Nos. JP 2004031445 and JP 2004058583).

However, safety glass interlayers and solar encapsulant layers formed of such acid copolymers tend not to have adequate light transmission properties and sufficient adhesion strength to other laminate layers, especially under severe environmental testing. Moreover, the solar cell encapsulant layers formed of such acid copolymers often fail to provide adequate protection to the solar cell component from shock. On the other hand, safety glass interlayers and solar encapsulant layers formed of the acid terpolymers taught by the prior art also do not have the desired light transmission property and adhesion strength to other laminate layers. In addition, less heat resistance is often associated with the glass interlayers or solar cell encapsulant layers derived from such acid terpolymers, due to their low melting points. One way to overcome this is to add organic peroxides to the acid terpolymer compositions. However, the addition of organic peroxides may complicate the melt compounding, the sheet formation, and/or the lamination process. For example, when such acid terpolymer compositions are used in forming the solar cell encapsulant layers, it is necessary to use a two-step lamination process to prepare such solar cell laminates. Particularly, after a pre-lamination assembly is assembled, it is necessary to have a low temperature step to allow the encapsulant film or sheet layer to adhere to the other laminate layers and a high temperature step to cure the films or sheets to provide the enhanced thermal resistance.

There is a need for polymeric films or sheets suitable as safety glass interlayers or solar cell encapsulant layers, which are transparent, highly adhesive to other laminate layers, and moisture and heat resistant.

SUMMARY OF THE INVENTION

The invention is directed to a multilayer film or sheet comprising a first surface sub-layer, a second surface sub-layer, and optionally one or more inner sub-layers sandwiched between the first and second surface sub-layers, wherein the first surface sub-layer comprises an acid terpolymer; at least one of the second surface sub-layer and the optional inner sub-layer(s) comprises a high melting point polymer; the acid terpolymer comprises repeat units derived from an α-olefin, about 5 to about 15 wt % of repeat units derived from an α,β-ethylenically unsaturated carboxylic acid having 3 to 8 carbons, and about 15 to about 40 wt % of repeat units derived from an α,β-ethylenically unsaturated carboxylic acid ester having 4 to 12 carbons, based on the total weight of the terpolymer; and the high melting point polymer has a melting point of at least about 80° C.

The invention is further directed to an article comprising at least one layer of the multilayer film or sheet described above, such as a safety laminate further comprising at least one outer laminate layer comprising or formed of a rigid sheet or polymeric film or a solar cell pre-laminate assembly further comprising a solar cell component formed of one or a plurality of electronically interconnected solar cells.

The invention is yet further directed to a process of laminating the solar cell pre-lamination assembly, and a solar cell module prepared therefrom.

DETAILED DESCRIPTION OF THE INVENTION

The term "acid copolymer" refers to a polymer comprising copolymerized units derived from an α-olefin, an α,β-ethylenically unsaturated carboxylic acid, and optionally other suitable comonomers such as, for example, an α,β-ethylenically unsaturated carboxylic acid ester.

The term "ionomer" refers to a polymer that is derived from a parent acid copolymer, as disclosed above, by partially or fully neutralizing the parent acid copolymer.

Acid Terpolymer Multilayer Films and Sheets

The acid terpolymer multilayer polymeric film or sheet has two or more sub-layers, wherein at least one of the surface sub-layers is formed of an acid terpolymer composition comprising an acid terpolymer comprising repeat units derived from an α-olefin having 2 to 10 carbons, about 5 to about 15 wt % of an α,β-ethylenically unsaturated carboxylic acid having 3 to 8 carbons, and about 15 to about 40 wt % of an α,β-ethylenically unsaturated carboxylic acid ester having 4 to 12 carbons, based on the total weight of the terpolymer. The term "surface sub-layers" refers to the two sub-layers forming the two outer surfaces of the acid terpolymer multilayer film or sheet. In addition, the acid terpolymer multilayer film or sheet may further comprise at least one sub-layer, preferably, an inner sub-layer, formed of a polymer composition with a melting point of about 80° C. or higher. The term "inner sub-layers" refers to the sub-layer(s) that is positioned between the two surface sub-layers. When in a bi-layer form, the acid terpolymer multilayer film or sheet may comprise a first sub-layer comprising the acid terpolymer composition and a second sub-layer comprising the high melting point polymer composition. In addition, when the multilayer film or sheet has three or more sub-layers, it is preferred that at least one of the two surface sub-layers, or more preferably both of the two surface sub-layers, are formed of the acid terpolymer composition and at least one of the other sub-layers, or more preferably at least one of the inner sub-layer(s) is formed of the high melting point polymer composition. The other sub-layer(s) of the multilayer film or sheet may be formed of any other suitable polymer compositions comprising polymeric materials selected from acid copolymers, ionomers, poly(ethylene-co-vinyl acetates), poly(vinyl acetals) (e.g., poly(vinyl butyrals)), thermoplastic polyurethanes, poly(vinyl chlorides), polyethylenes (e.g., metallocene-catalyzed linear low density polyethylenes), polyolefin block elastomers, poly(α-olefin-co-α,β-ethylenically unsaturated carboxylic acid ester) copolymers (e.g., poly(ethylene-co-methyl acrylate) and poly(ethylene-co-butyl acrylate)), silicone elastomers, and epoxy resins.

Preferably, the acid terpolymer comprises about 7 to about 11 wt %, or about 9 wt %, of copolymerized units of the α,β-ethylenically unsaturated carboxylic acid, and about 20 to about 30 wt %, or about 23 to about 24 wt %, of polymerized units of the α,β-ethylenically unsaturated carboxylic acid ester, based on the total weight of the terpolymer.

The α-olefin comonomers may include, but are not limited to, ethylene, propylene, 1-butene, 1-pentene, 1-hexene, 1-heptene, 3 methyl-1-butene, 4-methyl-1-pentene, and the like and mixtures of two or more thereof. Preferably, the α-olefin is ethylene.

The α,β-ethylenically unsaturated carboxylic acid comonomers may include, but are not limited to, acrylic acids, methacrylic acids, itaconic acids, maleic acids, maleic anhydrides, fumaric acids, monomethyl maleic acids, and mixtures of two or more thereof. Preferably, the α,β-ethylenically unsaturated carboxylic acid is selected from acrylic acids, methacrylic acids, and mixtures of two or more thereof.

The α,β-ethylenically unsaturated carboxylic acid ester comonomers may include, but are not limited to, methyl acrylates, methyl methacrylates, ethyl acrylates, ethyl methacrylates, isopropyl acrylates, isopropyl methacrylates, butyl acrylates, butyl methacrylates, and mixtures of two or more thereof. Preferably, the α,β-ethylenically unsaturated carboxylic acid ester is selected from methyl acrylates and butyl acrylates.

The acid terpolymers may be polymerized as disclosed in U.S. Pat. Nos. 3,404,134; 5,028,674; 6,500,888; and 6,518,365.

A most preferred acid terpolymer used here is poly(ethylene-co-butyl acrylate-co-methacrylic acid).

The high melting point polymer composition has a melting point of at least about 80° C., or at least about 90° C., or at least about 95° C.

Preferably, the high melting point polymer compositions comprises a polymer selected from acid copolymers, ionomers, poly(ethylene-co-vinyl acetates), thermoplastic polyurethanes, poly(vinyl chlorides), polyethylenes, poly(α-olefin-co-α,β-ethylenically unsaturated carboxylic acid ester) copolymers (e.g., poly(ethylene-co-methyl acrylates) and poly(ethylene-co-butyl acrylates)), polyesters (e.g., PETG amorphous polyesters (Eastman Chemical Company, Kingsport, Tenn.)), and epoxy resins. More preferably, the high melting point polymer compositions comprise polymers selected from acid copolymers and ionomers.

Most preferably, the high melting point polymer composition comprises an ionomer derived from an acid copolymer that comprises copolymerized units of an α-olefin and an α,β-ethylenically unsaturated carboxylic acid and is neutralized to a level of about 1% to about 90%, or about 10% to about 40% with a metal ion selected from sodium, zinc, magnesium, and lithium. The most preferred metal ion used here to neutralize the acid copolymer is zinc. Specific examples of ionomer compositions include those Surlyn® products available from E.I. du Pont de Nemours and Company, Wilmington, Del. (DuPont).

The polymer compositions may further comprise any suitable additives known within the art including plasticizers, processing aides, lubricants, flame retardants, impact modifiers, nucleating agents, antiblocking agents (e.g., silica), thermal stabilizers, UV absorbers, UV stabilizers, dispersants, surfactants, chelating agents, coupling agents, adhesives, primers, and the like, or mixtures of two or more thereof. The total amount of additives comprised in a composition may be from about 0.001 up to about 5 wt %, based on the total weight of the composition.

The acid terpolymer composition optionally further comprises one or more silane coupling agents to further enhance the adhesion strength of the multilayer films or sheets comprising the same. Exemplary coupling agents include, but are not limited to, γ-chloropropylmethoxysilane, vinyltrimethoxysilane, vinyltriethoxysilane, vinyltris(β-methoxyethoxy)silane, γ-vinylbenzylpropyltrimethoxysilane, N-β-(N-vinyl benzylaminoethyl)-γ-aminopropyltrimethoxysilane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, vinyltrichlorosilane, γ-mercaptopropylmethoxysilane, γ-aminopropyltriethoxysilane, N-β-(aminoethyl)-γ-aminopropyltrimethoxysilane, and the like and mixtures of two or more thereof. The silane coupling agents are preferably present in the acid terpolymer composition at a level of about 0.01 to about 5 wt %, or about 0.05 to about 1 wt %, based on the total weight of the composition. More preferably, however, the acid terpolymer compositions do not comprise any adhesion promoting agents, such as the above mentioned silane coupling agents.

The high melting point polymer compositions optionally further comprise additives to reduce the melt flow of the resin, to the limit of thermosetting the films or sheets derived therefrom during lamination and therefore provide lamination products comprising the same with even greater thermal resistance and fire resistance. By the addition of such additives, the end-use temperature may be enhanced by about 20° C. to about 70° C. Typically, the effective melt flow reducing additives are organic peroxides, such as 2,5-dimethylhexane-2,5-dihydroperoxide, 2,5-dimethyl-2,5-di(tert-betylperoxy) hexane-3, di-tert-butyl peroxide, tert-butylcumyl peroxide, 2,5-dimethyl-2,5-di(tert-butylperoxy)hexane, dicumyl peroxide, α,α'-bis(tert-butyl-peroxyisopropyl)benzene, n-butyl-4,4-bis(tert-butylperoxy)valerate, 2,2-bis(tert-butylperoxy)butane, 1,1-bis(tert-butylperoxy)cyclohexane, 1,1-bis(tert-butylperoxy)-3,3,5-trimethyl-cyclohexane, tert-butyl peroxybenzoate, benzoyl peroxide, and the like and mixtures or combinations thereof. Preferably the organic peroxides used herein decompose at a temperature of about 100° C. or higher to generate radicals. More preferably, the organic peroxides used herein have a decomposition temperature which affords a half life of 10 hours at about 70° C. or higher to provide improved stability for blending operations. The organic peroxides may be added at a level of about 0.01 to about 10 wt %, or about 0.5 to about 3.0 wt %, based on the total weight of the composition. Preferably, however, the high melting point polymer compositions do not comprise flow reducing additives, such as the above mentioned peroxides, to allow the entire multilayer sheet to be thermoplastic and to allow for recycling.

If desired, initiators, such as dibutyltin dilaurate, may be contained in the acid terpolymer compositions at a level of about 0.01 to about 0.05 wt %, based on the total weight of the composition. In addition, if desired, inhibitors, such as hydroquinone, hydroquinone monomethyl ether, p-benzoquinone, and methylhydroquinone, may be added to the acid terpolymer compositions at a level of less than about 5 wt %, based on the total weight of the composition.

Each of the acid terpolymer containing surface sub-layer(s) may have a thickness of about 0.5 mils (0.013 mm) to about 5 mils (0.13 mm), or about 0.5 mils to about 3 mils (0.076 mm), and each of the high melting point polymer containing inner sub-layer(s) may have a thickness of about 0.5 mils (0.013 mm) to about 120 mils (3 mm), or about 10 mils (0.25 mm) to about 90 mils (2.28 mm), or about 30 mils (0.76 mm) to about 60 mils (1.52 mm). The total thickness of the multilayer films or sheets may be in the range of about 2 mils (0.051 mm) and about 250 mils (6.35 mm).

When the acid terpolymer multilayer film or sheet is comprised in a safety laminate interlayer as an interlayer film or sheet, it is preferred to have a total thickness of about 10 mils (0.25 mm) to about 250 mils (6.35 mm), or about 15 mils (0.38 mm) to about 90 mils (2.28 mm), or about 30 mils (0.76 mm) to about 60 mils (1.52 mm), and when the multilayer sheet is comprised in a solar cell module as an encapsulant layer, it is preferred to have a total thickness of about 2 mil (0.051 mm) to about 20 mils (0.51 mm). In addition, with flexible solar cell laminates, it is preferred to have at least one encapsulant layer formed of a thin acid terpolymer multilayer film as disclosed above, which has thickness of about 2 mil (0.051 mm) to about 10 mils (0.25 mm), or about 2 mil (0.051 mm) to about 5 mils (0.13 mm), and with rigid solar cell laminates, it is preferred to have at least one encapsulant layer formed of a thick acid terpolymer multilayer sheet as disclosed above, which has a thickness of about 10 mils (0.25 mm) to about 20 mils (0.51 mm).

The acid terpolymer multilayer films or sheets may have smooth or rough surfaces on one or both sides. Preferably, the multilayer films or sheets have rough surfaces on both sides to facilitate the deareation of the laminates during the laminate process. Rough surfaces can be made by mechanically embossing or by melt fracture during extrusion of the multilayer films or sheets followed by quenching so that the roughness is retained during handling.

The acid terpolymer multilayer film or sheet has a percent transmission of about 80% to about 100%, as measured by ASTM D1003. Preferably, the acid terpolymer multilayer film or sheet has a percent transmission of about 90% to about 100% transmission. In addition, it desirably provides a percent clarity of about 90% to 100%, or about 95% to 100%, or about 98% to 100%, as measured by ASTM D1003.

The acid terpolymer multilayer films or sheets can be produced by any suitable process. For example, the multilayer sheets may be formed through dipcoating, solution casting, compression molding, injection molding, lamination, melt extrusion, blown film, or any other procedures that are known to those of skill in the art. Preferably, the multilayer sheets are formed by melt coextrusion or melt extrusion coating processes.

Laminates

The invention further provides a laminate (e.g., a safety laminate, a solar cell pre-lamination assembly, or a solar cell module derived therefrom) comprising at least one layer of the acid terpolymer multilayer film or sheet.

The use of such an acid terpolymer multilayer film or sheet in safety laminates and solar cell modules may provide advantages over other prior art polymeric films or sheet. First, the acid terpolymer comprised in the multilayer film or sheet has higher clarity over the prior art acid terpolymers. For example, as illustrated by Examples CE1, CE2 and E1, the percent haze of the acid terpolymer used here is reduced by 17% to 22% over the prior art acid terpolymers. Secondly, the acid terpolymer comprised in the multilayer film of sheet has great adhesion strength to other laminate layers, such as glass, especially after severe environmental aging, such as after being kept under high temperature (e.g., about 75° C. or higher) and high humidity (e.g., relative humidity of about 85% or higher) conditions for a prolonged period of time (e.g., about 750 hours or longer). (See, e.g., Table 1 and Examples CE5, CE6, and E6-E8). Thirdly, the addition of the high melting point polymer in the multilayer film or sheet may further provide enhanced thermal resistance.

In one embodiment, the laminate is a safety laminate including a polymeric interlayer comprising a layer of the above disclosed acid terpolymer multilayer film or sheet.

The polymeric interlayer optionally further comprises one or more other interlayer films or sheets made of other suitable polymeric materials. Such optional other interlayer sheets may be made of polymeric materials selected from acid copolymers, ionomers, poly(ethylene-co-vinyl acetates), poly(vinyl acetals) (including acoustic grade poly(vinyl acetals)), polyurethane, poly(vinyl chlorides), polyethylenes (e.g., metallocene-catalyzed low density polyethylenes), polyolefin block elastomers, ethylene acrylate ester copolymers (e.g., poly(ethylene-co-methyl acrylate) and poly(ethylene-co-butyl acrylate)), silicone elastomers, epoxy resins, and mixtures of two or more thereof. Such optional other interlayer films may be made of a polymeric materials selected from polyesters (e.g., poly(ethylene terephthalate)), poly(ethylene naphthalates), polycarbonates, polyolefins (e.g., polypropylene, polyethylene, and cyclic polyolefins), norbornene polymers, polystyrenes (including syndiotactic polystyrenes), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophanes, vinyl chloride polymers (e.g., poly(vinylidene chloride)), fluoropolymers (e.g., polyvinyl fluoride, polyvinylidene fluoride, polytetrafluoroethylene, ethylene-tetrafluoroethylene copolymers, etc.) and the like. The optionally other interlayer films may also be coated if desired. For example, the films may be coated with organic infrared absorbers and sputtered metal layers, such as silver, coatings and the like. Metal coated polymeric films are disclosed in, e.g., U.S. Pat. Nos. 3,718,535; 3,816,201; 4,465,736; 4,450,201; 4,799,745; 4,846,949; 4,954,383; 4,973,511; 5,071,206; 5,306,547; 6,049,419; 6,104,530; 6,204,480; 6,255,031; and 6,565,982. For example, the coating may function as oxygen and moisture barrier coatings, such as the metal oxide coating disclosed within U.S. Pat. Nos. 6,521,825 and 6,818,819 and European Pat No. EP1182710.

The thickness of the other optional interlayer film(s) or sheet(s) may range from about 0.1 mils (0.003 mm) to about 10 mils (0.26 mm), or preferably, from about 1 mil (0.025 mm) to about 7 mils (0.18 mm), and the total thickness of all the component films or sheets in the interlayer does not exceed 250 mils (6.35 mm).

The laminate may further comprise an outer layer bonded to one side of the interlayer, or two outer layers bonded to either side of the interlayer where each outer layer may be a rigid sheet or a polymeric film.

The rigid sheets include glass sheets and rigid polymeric sheets having a thickness of about 10 to about 250 mils (0.25-6.35 mm) including, but not limited to, polycarbonates, acrylics, polyacrylates, cyclic polyolefins (e.g., ethylene norbornene polymers), polystyrenes (preferably metallocene-catalyzed polystyrenes), polyamides, polyesters, fluoropolymers and the like and combinations of two or more thereof. Preferably, the rigid polymeric sheets are made of polymeric materials having a modulus of at least 10,000 psi (69 MPa).

Glass includes not only window glass, plate glass, silicate glass, sheet glass, low iron glass, tempered glass, tempered CeO-free glass, and float glass, but also to include colored glass, specialty glass (such as those include ingredients to control, e.g., solar heating), coated glass (such as those sputtered with metals (e.g., silver or indium tin oxide) for solar control purposes), E-glass, Toroglass, Solex® glass (PPG Industries, Pittsburgh, Pa.). Such specialty glasses are disclosed in, e.g., U.S. Pat. Nos. 4,615,989; 5,173,212; 5,264,286; 6,150,028; 6,340,646; 6,461,736; and 6,468,934. The type of glass to be selected for a particular laminate depends on the intended use.

The polymeric films are preferably made of materials selected from polyesters (e.g., poly(ethylene terephthalate)), poly(ethylene naphthalate), polycarbonate, polyolefins (e.g., polypropylene, polyethylene, and cyclic polyloefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, poly(vinyl chlorides) (e.g., poly(vinylidene chloride)), fluoropolymers (e.g., polyvinyl fluoride, polyvinylidene fluoride, polytetrafluoroethylene, ethylene-tetrafluoroethylene copolymers, etc.), and the like or combinations of two or more thereof. More preferably, the polymeric films used here are polyester films, or most preferably, bi-axially oriented poly(ethylene terephthalate) films. Preferably, the polymeric films are hardcoated on the outside surface. By "hardcoated", it is meant that a clear anti-scratch and anti-abrasion hardcoat is coated on the outside surface of the polymeric film, with the outside surface being the surface that is further away from the interlayer of the safety laminate.

Hardcoat may comprise or be produced from polysiloxanes or cross-linked (thermosetting) polyurethanes. Also applicable herein are the oligomeric-based coatings disclosed in US Pat Appl No. 2005/0077002, which compositions are prepared by the reaction of (A) hydroxyl-containing oligomer with isocyanate-containing oligomer or (B) anhydride-containing oligomer with epoxide-containing compound. Preferably, the hardcoat are formed of polysiloxane abrasion resistant coatings (PARC), such as those disclosed in U.S. Pat. Nos. 4,177,315; 4,469,743; 5,415,942; and 5,763,089.

Prior to applying the hardcoat, the outside surface of the polymeric film may need to undergo adhesion enhancing treatment as disclosed above.

The polymeric films may also have a solar control material coated on one or both of its surfaces. Solar control materials may be infrared absorbing materials, such as metal oxide nanoparticles (e.g., antimony tin oxide nanoparticles, indium tin oxide nanoparticles, or combinations thereof), metal boride nanoparticles (e.g., lanthanum hexaboride nanoparticles), or combinations of two or more thereof. The polymeric films may also be coated with an infrared energy reflective layer, such as a metal layer, a Fabry-Perot type interference filter layer, a layer of liquid crystals, or combinations of two or more thereof.

If desired, one or both surfaces of the laminate layers, such as the acid terpolymer multilayer film(s) or sheet(s) disclosed herein, the optional other interlayer sheet(s) or film layer(s), the rigid sheet(s), or the polymeric film(s), may be treated to further enhance the adhesion to other laminate layers. This adhesion enhancing treatment may take any form known within the art and include flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and the like and combinations of two or more thereof. Also, the adhesion strength may be further improved by further applying an adhesive or primer coating on the surface of laminate layer(s). For example, U.S. Pat. No. 4,865,711 discloses a film or sheet with improved bondability, which has a thin layer of carbon deposited on one or both surfaces. Other exemplary adhesives or primers may include silanes, poly(allyl amine) based primers (see e.g., U.S. Pat. Nos. 5,411,845; 5,770,312; 5,690,994; and 5,698,329), and acrylic based primers (see e.g., U.S. Pat. No. 5,415,942).

The adhesives or primers coating may be about 0.0004 to about 1 mil (0.00001-0.03 mm), or about 0.004 to about 0.5 mil (0.0001-0.013 mm), or about 0.004 to about 0.1 mil (0.0001-0.003 mm) thick.

Preferably, the acid terpolymer multilayer films and sheets do not undergo any adhesion enhancing treatment and are self-adhered to the other laminate layers.

The safety laminate may take any form known within the art. Preferable specific glass laminate constructions include:
glass/ATR;
glass/ATR/film (e.g., hardcoated poly(ethylene terephthalate) film);
glass/ATR/glass;
hardcoated/ATR/film;
glass/ATR/polymeric film/ATR/glass;
glass/ATR/polymeric film/ATR/film;
and the like, wherein "ATR" stands for the acid terpolymer multilayer film or sheet disclosed above.

The safety laminates may be produced by any of the lamination process that are described below in detail, or by other processes known to one skilled in the art.

The laminate may be a solar cell pre-lamination assembly which comprises a solar cell component formed of one or a plurality solar cells and at least one layer of the acid terpolymer multilayer film or sheet described above.

Solar cell is meant to include any article which can convert light into electrical energy. Typical art examples of the various forms of solar cells include, for example, single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells include multi-crystalline solar cells, thin film solar cells, compound semiconductor solar cells and amorphous silicon solar cells.

Thin film solar cells are typically produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module. By way of example, thin film solar cells are disclosed in U.S. Pat. Nos. 5,512,107; 5,948,176; 5,994,163; 6,040,521; 6,137,048; and 6,258,620.

The solar cell pre-lamination assembly typically comprises at least one layer of the acid terpolymer multilayer film or sheet, which is positioned next to the solar cell component and serves as one of the encapsulant layers, or preferably, the acid terpolymer multilayer film or sheet is positioned next to the solar cell component to the light-receiving side and serves as the front encapsulant layer.

The solar cell pre-lamination assembly may further comprise encapsulant layers formed of other polymeric materials, such as, acid copolymers, ionomers, ethylene vinyl acetates, poly(vinyl acetals) (including acoustic grade poly(vinyl acetals), polyurethanes, polyvinylchlorides, polyethylenes (e.g., linear low density polyethylenes), polyolefin block elastomers, poly($\alpha$-olefin-co-$\alpha,\beta$-ethylenically unsaturated carboxylic acid ester) copolymers (e.g., poly(ethylene-co-methyl acrylate) and poly(ethylene-co-butyl acrylate)), silicone elastomers, epoxy resins, and combinations of two or more thereof. Preferably, the solar cell pre-lamination assembly comprises two layers of the acid terpolymer multilayer film or sheet disclosed herein, wherein each of the two acid terpolymer multilayer films or sheets are laminated to each of the two sides of the solar cell component and serve as the front and back encapsulant layers.

The thickness of the individual encapsulant layers other than the multilayer film(s) or sheet(s) disclosed herein may independently range from about 1 mil (0.026 mm) to about 120 mils (3 mm), or from about 1 mil to about 40 mils (1.02 mm), or from about 1 mil to about 20 mils (0.51 mm). All the encapsulant layer(s) comprised in the solar cell pre-lamination assemblies, may have smooth or rough surfaces. Preferably, the encapsulant layer(s) have rough surfaces to facilitate the deareation of the laminates through the lamination process.

The solar cell pre-lamination assembly may yet further comprise an incident layer and/or a backing layer serving as the outer layers of the assembly at the light-receiving side and the back side, respectively.

The outer layers of the solar cell pre-lamination assemblies, i.e., the incident layer and the backing layer, may be derived from any suitable sheets or films. Suitable sheets used herein may be glass or plastic sheets, such as, polycarbonates, acrylics, polyacrylates, cyclic polyolefins (e.g., ethylene norbornene polymers), polystyrenes (preferably metallocene-catalyzed polystyrenes), polyamides, polyesters, fluoropolymers and the like and combinations of two or more thereof. In addition, metal sheets, such as aluminum, steel, galvanized steel, or ceramic plates may be utilized in forming the backing layer.

Suitable film layers used herein may be polymers that include but are not limited to, polyesters (e.g., poly(ethylene terephthalate)), poly(ethylene naphthalate), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, poly(vinyl chlorides) (e.g., poly(vinylidene chloride)), fluoropolymers (e.g., polyvinyl fluoride, polyvinylidene fluoride, polytetrafluoroethylene, ethylene-tetrafluoroethylene copolymers, etc.) and the like, or combinations of two or more thereof. Most preferably, the polymeric film is bi-axially oriented polyester film (preferably poly(ethylene terephthalate) film) or a fluoropolymer film (e.g., Tedlar®, Tefzel®, and Teflon® films, from DuPont). Fluoropolymer-polyester-fluoropolymer ("TPT") films are also preferred for some applications. Metal films, such as aluminum foil may also be used as the back-sheet.

The solar cell pre-lamination assembly may further comprise other functional film or sheet layers (e.g., dielectric layers or barrier layers) embedded within the assembly. Such functional layers may be derived from any of the above mentioned polymeric films or those that are coated with additional functional coatings. For example, poly(ethylene terephthalate) films coated with a metal oxide coating, such as those disclosed within U.S. Pat. Nos. 6,521,825; 6,818,819; and European Pat No. EP1182710, may function as oxygen and moisture barrier layers in the laminates.

If desired, a layer of non-woven glass fiber (scrim) may also be included in the solar cell laminates to facilitate deareation during the lamination process or to serve as reinforcement for the encapsulant layer(s). The use of such scrim layers within solar cell laminates is disclosed within, e.g., U.S. Pat. Nos. 5,583,057; 6,075,202; 6,204,443; 6,320,115; 6,323,416; and European Pat No. EP0769818.

The film or sheet layers positioned to the light-receiving side of the solar cell component are preferably made of transparent material to allow efficient transmission of sunlight into the solar cell component. A special film or sheet may be included to serve both the function of an encapsulant layer and an outer layer. It is also conceivable that any of the film or sheet layers included in the assembly may be in the form of a pre-formed single-layer or multi-layer film or sheet.

If desired, one or both surfaces of the laminate layers of the solar cell pre-lamination assemblies may be treated to enhance the adhesion strength, as described above.

Preferably, the acid terpolymer multilayer films and sheets disclosed here do not undergo any adhesion enhancing treatment and are self-adhered to the other laminate layers.

The solar cell pre-lamination assemblies may take any form known within the art. Preferable specific solar cell pre-lamination constructions (top (light receiving) side to back side) include, glass/ATR/solar cell/ATR/glass; glass/ATR/solar cell/ATR/fluoropolymer film (e.g., Tedlar® film);

fluoropolymer film/ATR/solar cell/ATR/glass;
fluoropolymer film/ATR/solar cell/ATR/fluoropolymer film;

glass/ATR/solar cell/ATR/polyester film (e.g., poly(ethylene terephthalate) film);
fluoropolymer film/ATR/solar cell/ATR/polyester film;
glass/ATR/solar cell/ATR/barrier film layer/ATR/glass;
fluoropolymer film/ATR/barrier film layer/ATR/solar cell/ATR/barrier film layer/ATR/fluoropolymer film;
glass/ATR/solar cell/ATR/aluminum stock; fluoropolymer film/ATR/solar cell/ATR/aluminum stock;
glass/ATR/solar cell/ATR/galvanized steel sheet;
glass/ATR/solar cell/ATR/PET film/ATR/aluminum stock;
fluoropolymer film/ATR/solar cell/ATR/PET film/ATR/aluminum stock;
glass/ATR/solar cell/ATR/polyester film/ATR/galvanized steel sheet;
fluoropolymer film/ATR/solar cell/ATR/PET film/ATR/galvanized steel sheet;
glass/ATR/solar cell/acoustic poly(vinyl butyral) sheet/glass;
glass/ATR/solar cell/poly(vinyl butyral) sheet/fluoropolymer film;
fluoropolymer film/ATR/solar cell/acid copolymer sheet/fluoropolymer film; glass/ATR/solar cell/poly(ethylene-co-vinyl acetate) sheet/polyester film;
fluoropolymer film/ATR/solar cell/poly(ethylene-co-methyl acrylate) sheet/polyester film;
glass/poly(ethylene-co-butyl acrylate) sheet/solar cell/ATR/barrier film layer/poly(ethylene-co-butyl acrylate) sheet/glass, and the like, wherein "ATR" stands for the acid terpolymer multilayer film or sheet disclosed herein. In addition, besides the Tedlar® film from DuPont, suitable fluoropolymer films also include fluoropolymer-polyester-fluoropolymer (TPT) trilayer films.

The invention further provides solar cell laminates derived from the solar cell pre-lamination assemblies disclosed above. Specifically the solar cell laminates are formed by subjecting the solar cell pre-lamination assemblies to further lamination process, as provided below in detail.

Lamination Process

Any lamination process known within the art may be used to prepare the safety glass laminates or solar cell laminates. The lamination process may be an autoclave or non-autoclave process.

In an exemplary process, the component layers of a safety glass laminate or a solar cell laminate are stacked up in the desired order to form a pre-lamination assembly. The assembly is then placed into a bag capable of sustaining a vacuum ("a vacuum bag"), the air is drawn out of the bag by a vacuum line or other means, the bag is sealed while the vacuum is maintained (e.g., about 27-28 inches Hg (689-711 mm Hg)), and the sealed bag is placed in an autoclave at a pressure of about 150 to about 250 psi (about 11.3-18.8 bar), a temperature of about 130° C. to about 180° C., or about 120° C. to about 160° C., or about 135° C. to about 160° C., or about 145° C. to about 155° C., for about 10 to about 50 minutes, or about 20 to about 45 minutes, or about 20 to about 40 minutes, or about 25 to about 35 minutes. A vacuum ring may be substituted for the vacuum bag. One type of suitable vacuum bags is disclosed within U.S. Pat. No. 3,311,517. Following the heat and pressure cycle, the air in the autoclave is cooled without adding additional gas to maintain pressure in the autoclave. After about 20 minutes of cooling, the excess air pressure is vented and the laminates are removed from the autoclave.

Alternatively, the pre-lamination assembly may be heated in an oven at about 80° C. to about 120° C., or about 90° C. to about 100° C., for about 20 to about 40 minutes, and thereafter, the heated assembly is passed through a set of nip rolls so that the air in the void spaces between the individual layers may be squeezed out, and the edge of the assembly sealed. The assembly at this stage is referred to as a pre-press.

The pre-press may then be placed in an air autoclave where the temperature is raised to about 120° C. to about 160° C., or about 135° C. to about 160° C., at a pressure of about 100 to about 300 psi (about 6.9 to about 20.7 bar), or about 200 psi (13.8 bar). These conditions are maintained for about 15 to about 60 minutes, or about 20 to about 50 minutes, and after which, the air is cooled while no more air is added to the autoclave. After about 20 to about 40 minutes of cooling, the excess air pressure is vented, the laminated products are removed from the autoclave.

The glazing laminates may also be produced through non-autoclave processes. Such non-autoclave processes are disclosed, for example, within U.S. Pat. Nos. 3,234,062; 3,852,136; 4,341,576; 4,385,951; 4,398,979; 5,536,347; 5,853,516; 6,342,116; 5,415,909; US Pat Appl No. 2004/0182493; European Pat No. EP1235683 B1; and PCT Pat Appl Nos. WO91/01880 and WO03/057478 A1. Generally, the non-autoclave processes include heating the pre-lamination assembly and the application of vacuum, pressure or both. For example, the assembly may be successively passed through heating ovens and nip rolls.

This should not be considered limiting. Essentially any lamination process may be used.

EXAMPLES

The following Examples and Comparative Examples are intended to be illustrative of the present invention, and are not intended in any way to limit the scope of the present invention.

Melt Index

Melt Index (MI) was measured by ASTM D1238 at 190° C. using a 2160 g load.

Melting Point

Melting point was measured by differential scanning calorimetry (DSC).

Lamination Process 1

The component layers of the laminate are stacked to form a pre-lamination assembly. For the assembly containing a polymeric film layer as the outer surface layer, a cover glass sheet is placed over the film layer. The pre-lamination assembly is then placed within a Meier ICOLAM® 10/08 laminator (Meier laminator; Meier Vakuumtechnik GmbH, Bocholt, Germany). The lamination cycle includes an evacuation step (vacuum of 3 in Hg (76 mm Hg)) of 5.5 minutes and a pressing stage (pressure of 1000 mbar) of 5.5 minutes at a temperature of 145° C. The resulting laminate is then removed from the laminator.

Lamination Process 2

The component layers of the laminate are stacked to form a pre-lamination assembly. For the assembly containing a polymeric film layer as the outer surface layer, a cover glass sheet is placed over the film layer. The pre-lamination assembly is then placed within a vacuum bag, which is sealed and a vacuum is applied to remove the air from the vacuum bag. The bag is placed into an oven and heated to about 90° C. to about 100° C. for 30 minutes to remove any air contained between the assembly. The assembly is then subjected to autoclaving at 140° C. for 30 minutes in an air autoclave to a pressure of 200 psig (14.3 bar). The air is cooled while no more air is added to the autoclave. After 20 minutes of cooling and when the air temperature reaches less than about 50° C., the excess pressure is vented, and the resulting laminate is removed from the autoclave.

Materials

The following films and sheets are used in examples 9-60:

AL is a 3.2 mm thick aluminum sheet that is 5052 alloyed with 2.5 wt % of magnesium and conforms to Federal specification QQ-A-250/8 and ASTM B209.

ATR 1 is a 30 mil (0.76 mm) thick embossed tri-layer sheet having (i) two 2 mil (0.06 mm) thick surface layers made of "Acid Terpolymer A" and (ii) an inner layer made of Surlyn® 9520 (DuPont), wherein "Acid Terpolymer A" has a MI of 2.5 g/10 min and is a poly(ethylene-co-n-butyl acrylate-co-methacrylic acid) containing, based on the total weight of the terpolymer, 23 wt % repeat units of n-butylacrylate and 9 wt % repeat units of methacrylic acid.

ATR 2 is a 60 mil (1.52 mm) thick embossed tri-layer sheet having (i) two 1 mil (0.03 mm) thick surface layers made of a composition comprising 99.85 wt % of "Acid Terpolymer B" and 0.15 wt % of TINUVIN 328 (Ciba Specialty Chemicals, Tarrytown, N.Y.), based on the total weight of the composition and (ii) an inner layer made of "Ionomer A", wherein, "Acid Terpolymer B" has a MI of 10 g/10 min and is a poly(ethylene-co-n-butyl acrylate-co-methacrylic acid) containing, based on the total weight of the terpolymer, 24 wt % repeat units of n-butylacrylate and 9 wt % repeat units of methacrylic acid, "Ionomer A" has a MI of 5 g/10 min and is derived from "Acid Copolymer A" that is 70% neutralized with sodium ion, and wherein "Acid Copolymer A" is a poly(ethylene-co-methacrylic acid) containing 15 wt % repeat units of methacrylic acid, based on the total weight of the copolymer.

ATR 3 is a 15 mil (0.38 mm) thick embossed tri-layer sheet having (i) two 1 mil (0.03 mm) thick surface layers made of "Acid Terpolymer B" and (ii) an inner layer made of Surlyn® 8660 (Du Pont).

ATR 4 is a 90 mil (2.25 mm) thick embossed tri-layer sheet having (i) two 2 mil (0.06 mm) thick surface layers made of "Acid Terpolymer A" and (ii) an inner layer made of "Ionomer B", wherein "Ionomer B" has a MI of 1.5 g/10 min and is derived from "Acid Copolymer B" that is 35% neutralized with sodium ion, and wherein "Acid Copolymer B" is a poly(ethylene-co-methacrylic acid) containing, based on the total weight of the acid copolymer, 22 wt % of repeat units of methacrylic acid.

ATR 5 is a 20 mil (0.51 mm) thick embossed bi-layer sheet having (i) one 1 mil (0.03 mm) thick layer made of "Acid Terpolymer C" and (ii) one layer made of Surlyn®8940 (DuPont), wherein "Acid Terpolymer C" has the same comonomer content as "Acid Terpolymer B" but a MI of 5 g/10 min.

ATR 6 is a 20 mil (0.51 mm) thick embossed tri-layer sheet having (i) two 2 mil (0.06 mm) thick surface layers made of a composition of 99.5 wt % "Acid Terpolymer C" and 0.5 wt % of CYASORB UV-1164 (Cytec Industries Inc., West Paterson, N.J.), based on the total weight of the composition and (ii) an inner layer made of "Ionomer C", wherein Ionomer C has a MI of 5 g/10 min and is derived from "Acid Copolymer C" that is 30% neutralized with zinc ion, and wherein "Acid Copolymer C" is a poly(ethylene-co-methacrylic acid) containing, based on the total weight of the acid copolymer, 18 wt % repeat units of methacrylic acid.

ATR 7 is a 1 mil (0.03 mm) thick film made of "Acid Terpolymer A".

ATR 8 is a 1 mil (0.03 mm) thick film made of "Acid Terpolymer D", which has the same comonomer content as "Acid Terpolymer A" but a MI of 25 g/10 min.

ATR 9 is a 1 mil (0.03 mm) thick film made of a composition comprising 99.4 wt % of "Acid Terpolymer B", 0.3 wt % of TINUVIN 1577 and 0.3 wt % of CHIMASSORB 944 (Ciba Specialty Chemicals), based on the total weight of the composition.

ATR 10 is a 20 mil (0.51 mm) thick embossed tri-layer sheet having (i) two 1 mil (0.03 mm) thick surface layers made of "Acid Terpolymer D" and (ii) an inner layer made of Surlyn®9950 (Du Pont).

ATR 11 is a 20 mil (0.51 mm) thick embossed tri-layer sheet having (i) two 2 mil (0.06 mm) thick surface layers made of "Acid Terpolymer B" and (ii) an inner layer made of "Ionomer A".

ATR 12 is a 20 mil (0.51 mm) thick embossed tri-layer sheet having (i) two 1 mil (0.03 mm) thick surface layers made of "Acid Terpolymer C" and (ii) an inner layer made of "Ionomer D", which has a MI of 5 g/10 min and is derived from "Acid Copolymer A" that is 30% neutralized with zinc ion.

EBA is a 30 mil (0.76 mm) thick sheet made of a poly (ethylene-co-n-butyl acrylate) containing, based on the total weight of the polymer, 30 wt % of repeat units of n-butyl acrylate and having a MI of 2 g/10 min.

EVA is SC50B, believed to be a formulated composition based on poly(ethylene-co-vinyl acetate) in the form of a 20 mil thick (0.51 mm) sheet (Hi-Sheet Industries, Japan).

FPF is a 1.5 mil (0.038 mm) thick corona surface treated Tedlar® film (DuPont).

Glass 1 is 2.5 mm thick float glass.

Glass 2 is a 3.0 mm thick clear annealed float glass plate layer.

Glass 3 is a 3.0 mm thick Solex® solar control glass.

Glass 4 is Starphire® glass from the PPG Industries, Pittsburgh, Pa.

ION 1 is a 60 mil (1.52 mm) thick embossed sheet made of Ionomer E, which has a MI of approximately 2 g/10 min and is derived from "Acid Copolymer B" that is 27% neutralized with sodium ion.

ION 2 is a 20 mil (0.51 mm) thick embossed sheet made of Ionomer F, which has a MI of 2 g/10 min and is derived from a poly(ethylene-co-methacrylic acid) that contains, based on the total weight of the acid copolymer, 19 wt % repeat units of methacrylic acid, and is 37% neutralized with zinc ion.

ION 3 is a 20 mil (0.51 mm) thick embossed sheet made of Surlyn®9950 (DuPont).

PET 1 is a 7 mils (0.18 mm) thick poly(allyl amine)-primed, biaxially-oriented poly(ethylene terephthalate) film layer.

PET 2 is a XIR®-70 HP Auto film (Southwall Company, Palo Alto, Calif.).

PET 3 is a XIR®-75 Auto Blue V-1 film (Southwall).

PET 4 is a Soft Look® UV/IR 25 solar control film (Tomoegawa Paper Company, Ltd., Tokyo, Japan).

PET 5 is a XIR®-75 Green film (Southwall).

PET 6 is RAYBARRIER® TFK-2583 solar control film (Sumitomo Osaka Cement, Japan).

PVB-A is a 20 mil thick (0.51 mm) embossed sheet of an acoustic grade of poly(vinyl butyral).

PVB-B is B51V, believed to be a formulated composition based on poly(vinyl butyral) in the form of a 20 mil thick (0.51 mm) sheet (Du Pont).

Solar Cell 1 is a 10×10 in (254×254 mm) amorphous silicon photovoltaic device comprising a stainless steel substrate (125 μm thick) with an amorphous silicon semiconductor layer (see, e.g., U.S. Pat. No. 6,093,581, Example 1).

Solar Cell 2 is a 10×10 in (254×254 mm) copper indium diselenide (CIS) photovoltaic device (see, e.g., U.S. Pat. No. 6,353,042, column 6, line 19).

Solar Cell 3 is a 10×10 in (254×254 mm) cadmium telluride (CdTe) photovoltaic device (see, e.g., U.S. Pat. No. 6,353,042, column 6, line 49).

Solar Cell 4 is a silicon solar cell made from a 10×10 in (254×254 mm) polycrystalline EFG-grown wafer (see, e.g., U.S. Pat. No. 6,660,930, column 7, line 61).

TPT is a Akasol® PTL 3-38/75 film layer (Akasol® film layer; August Krempel Soehne GmbH & Co., Germany) described as a 7 mil thick white poly(vinylidene fluoride)/poly(ethylene terephthalate)/poly(vinylidene fluoride) tri-layer film with primer.

Comparative Example CE1

A poly(ethylene-co-iso-butyl acrylate-co-methacrylic acid) terpolymer containing, based on the total weight of the terpolymer, 10 wt % repeat units of iso-butyl acrylate and 10 wt % repeat units of methacrylic acid, was prepared and the haze value thereof was measured as 20%.

Comparative Example CE2

A poly(ethylene-co-n-butyl acrylate-co-methacrylic acid) terpolymer containing, based on the total weight of the terpolymer, 17 wt % repeat units of n-butyl acrylate and 10 wt % repeat units of methacrylic acid, was prepared and the haze value thereof was measured as 18.8%.

Example E1

A poly(ethylene-co-n-butyl acrylate-co-methacrylic acid) terpolymer containing, based on the total weight of the terpolymer, 23.5 wt % repeat units of n-butyl acrylate and 9 wt % repeat units of methacrylic acid, was prepared and the haze value thereof was measured as 15.6%.

Comparative Example CE3

A 4×4 in (102×102 mm) pre-lamination assembly was prepared by stacking a 3.2 mm thick Starphire® low iron glass layer (Starphire® glass layer; PPG Industries, Pittsburgh, Pa.), a 30 mil (0.76 mm) thick plaque composed of poly(ethylene-co-methyl acrylate) containing, based on the total weight of the polymer, 35 wt % repeat units of methyl acrylate, and an Akasol® film layer. The pre-lamination assembly was then laminated within a Meier laminator. The lamination cycle included an evacuation step (vacuum of 1 mbar) of 5.5 minutes, a pressure build up step of 1 minute and a pressing stage (pressure of 999 mbar) of 4 minutes at a temperature of 155° C.

Two resulting laminate samples were subjected to 1800 peel strength adhesion testing between the polymer layer and the glass layer using an Instron® Model #1125 (1000 lb test frame) Tester in accordance to ASTM D903 as modified with a cross-head speed of 100 mm/min. As shown in Table, low adhesion between the polymer layer and the glass layer was observed in both samples.

Comparative Example CE4

Two laminate samples similar as those in Comparative Example CE3 were prepared by replacing the poly(ethylene-co-methyl acrylate) with a poly(ethylene-co-methacrylic acid) containing, based on the total weight of the acid copolymer, 15 wt % repeat units of methacrylic acid. As shown in Table 1, good peel strength between the polymer layer and the glass layer were observed in the two samples.

Example E2

Two laminate samples similar as those in Comparative Example CE3 were prepared by replacing the poly(ethylene-co-methyl acrylate) with a poly(ethylene-co-n-butyl acrylate-co-methacrylic acid) terpolymer containing, based on the total weight of the terpolymer, 23.5 wt % repeat units of n-butyl acrylate and 9 wt % repeat units of methacrylic acid. As shown in Table 1, excellent peel strength between the polymer layer and the glass layer were observed in the two samples.

Example E3

Two laminate samples similar as those in Comparative Example CE3 were prepared by replacing the poly(ethylene-co-methyl acrylate) by a blend of 99.875 wt % of poly(ethylene-co-n-butyl acrylate-co-methacrylic acid) terpolymer and 0.125 wt % of 2-(aminoethyl)aminopropyltrimethoxysilane, wherein the poly(ethylene-co-n-butyl acrylate-co-methacrylic acid) terpolymer contains, based on the total weight of the terpolymer, 23.5 wt % of repeat units of n-butyl acrylate and 9 wt % repeat units of methacrylic acid. As shown in Table 1, good and excellent peel strength between the polymer layer and the glass layer were observed in sample #1 and sample #2, respectively.

Example E4

Two laminate samples similar as those in Comparative Example CE3 were prepared by replacing the poly(ethylene-co-methyl acrylate) by a blend of 99.75 wt % of poly(ethylene-co-n-butyl acrylate-co-methacrylic acid) and 0.25 wt % of 2-(aminoethyl)aminopropyltrimethoxysilane, wherein the poly(ethylene-co-n-butyl acrylate-co-methacrylic acid) terpolymer contains, based on the total weight of the terpolymer, 23.5 wt % of n-butyl acrylate and 9 wt % repeat units of methacrylic acid. As shown in Table 1, excellent and good peel strength between the polymer layer and the glass layer were observed in sample #1 and sample #2, respectively.

Example E5

The laminate samples similar as those in Comparative Example CE3 were prepared by replacing the poly(ethylene-co-methyl acrylate) by a blend of 99.5 wt % of poly(ethylene-co-n-butyl acrylate-co-methacrylic acid) and 0.5 wt % of 2-(aminoethyl)aminopropyltrimethoxysilane, wherein the poly(ethylene-co-n-butyl acrylate-co-methacrylic acid) terpolymer contains, based on the total weight of the terpolymer, 23.5 wt % repeat units of n-butyl acrylate and 9 wt % repeat units of methacrylic acid. As shown in Table 1, excellent and good peel strength between the polymer layer and the glass layer were observed in sample #1 and sample #2, respectively.

TABLE 1

| Example No. | | Peel Strength (lb-f/in (N/mm)) |
| --- | --- | --- |
| CE3 | Sample 1 | Low adhesion |
| | Sample 2 | Low adhesion |

TABLE 1-continued

| Example No. | | Peel Strength (lb-f/in (N/mm)) |
|---|---|---|
| CE4 | Sample 1 | 48.3 (8.5) |
| | Sample 2 | 53.4 (9.4) |
| E2 | Sample 1 | Cohesive failure |
| | Sample 2 | Cohesive failure |
| E3 | Sample 1 | 53.3 (9.3) |
| | Sample 2 | Cohesive failure |
| E4 | Sample 1 | Cohesive failure |
| | Sample 2 | 32.5 (5.7) |
| E5 | Sample 1 | Cohesive failure |
| | Sample 2 | 47.1 (8.3) |

Example E6

A 4×4 in (102×102 mm) pre-lamination assembly was prepared by stacking a 3.2 mm thick Starphire® low iron glass layer, a 20 mil (0.51 mm) thick sheet made of poly (ethylene-co-n-butyl acrylate-co-methacrylic acid) containing, based on the total weight of the terpolymer, 23.5 wt % repeat units of n-butyl acrylate and 9 wt % repeat units of methacrylic acid, and an Akasol® film layer. The pre-lamination assembly was then laminated within a Meier laminator. The lamination cycle included an evacuation step (vacuum of 1 mbar) of 4.5 minutes, a pressure build up stage of 1 minute and a pressing stage (pressure of 999 mbar) of 5.5 minutes at a temperature of 140° C.

The 180° peel strength between the terpolymer layer and the Akasol® PTL 3-38/75 film layer was tested and resulted in cohesive failure.

The 180° peel strength between the terpolymer layer and the glass layer was tested in two samples and both resulted in cohesive failure.

A further laminate sample was kept in an environment of 85° C. and 85% relative humidity (RH) for 840 hours prior to the 1800 peel strength testing between the terpolymer layer and the glass layer, which resulted in cohesive failure.

Comparative Example CE5

A 4×4 in (102×102 mm) pre-lamination assembly was prepared by stacking a 3.2 mm thick Starphire® glass layer, a 20 mil (0.51 mm) thick sheet composed of poly(ethylene-co-methacrylic acid) copolymer containing, based on the total weight of the acid copolymer, 15 wt % repeat units of methacrylic acid, and an Akasol® film layer. The pre-lamination assembly was then laminated within a Meier laminator. The lamination cycle included an evacuation step (vacuum of 1 mbar) of 5.5 minutes, a pressure build up stage of 1 minute and a pressing stage (pressure of 999 mbar) of 4 minutes at a temperature of 155° C.

The 180° peel strength between the acid copolymer layer and the glass layer was determined as 70.8 lb-f/in (12.4 N/mm).

A further laminate sample was kept in an environmental of 85° C. and 100% relative humidity for 670 hours prior to the 180° peel strength testing between the glass and the acid copolymer layers, which resulted in delamination.

Example E7

Laminate samples similar as those in CE5 were prepared by replacing the poly(ethylene-co-methacrylic acid) copolymer with a poly(ethylene-co-n-butyl acrylate-co-methacrylic acid) containing, based on the total weight of the terpolymer, 23.5 wt % repeat units of n-butyl acrylate and 9 wt % repeat units of methacrylic acid.

For sample #1, the 180° peel strength between the terpolymer layer and the glass layer were determined as 26.88 lb-f/in (4.7 N/mm) and for sample #2, the 1800 peel strength test resulted in cohesive failure.

Laminate sample were also kept in an environment of 85° C. and 85% relative humidity for 840 hours prior to the 1800 peel strength testing between the terpolymer layer and the glass layer, which resulted in cohesive failure.

Comparative Example CE6

A 4×4 in (102×102 mm) pre-lamination assembly was prepared by stacking a 3.2 mm thick Starphire® glass layer, a first 8 mil (0.20 mm) thick film composed of poly(ethylene-co-methacrylic acid) copolymer containing, based on the total weight of the acid copolymer, 15 wt % repeat units of methacrylic acid and 23% neutralized with zinc ions, a 20 mil (0.51 mm) thick sheet composed of poly(ethylene-co-n-butyl acrylate-co-methacrylic acid) containing, based on the total weight of the terpolymer, 23.5 wt % repeat units of n-butyl acrylate and 9 wt % repeat units of methacrylic acid, a second 8 mil (0.20 mm) thick film composed of the poly(ethylene-co-methacrylic acid) copolymer containing, based on the total weight of the acid copolymer, 15 wt % repeat units of methacrylic acid and 23% neutralized with zinc ions, and an Akasol® film layer. The pre-lamination assembly was then laminated within a Meier laminator. The lamination cycle included an evacuation step (vacuum of 1 mbar) of 4.5 minutes, a pressure build up stage of 1 minute and a pressing stage (pressure of 999 mbar) of 5.5 minutes at a temperature of 140° C.

The 180° peel strength between the multilayer sheet layer and the glass layer was determined as 16.05 lb-f/in (2.8 N/mm).

Example E8

A series of 4×4 in (102×102 mm) pre-lamination assemblies were prepared by stacking a 3.2 mm thick Starphire® glass layer, a first 2 mil (0.051 mm) thick film composed of poly(ethylene-co-n-butyl acrylate-co-methacrylic acid) containing, based on the total weight of the acid terpolymer, 23.5 wt % repeat units of n-butyl acrylate and 9 wt % repeat units of methacrylic acid, a first 20 mil (0.51 mm) thick sheet composed of poly(ethylene-co-methacrylic acid) copolymer containing, based on the total weight of the acid copolymer, 15 wt % repeat units of methacrylic acid and 23% neutralized with zinc ions, a second 20 mil (0.51 mm) thick sheet composed of the poly(ethylene-co-methacrylic acid) copolymer, a second 2 mil (0.051 mm) thick film composed of the poly (ethylene-co-n-butyl acrylate-co-methacrylic acid), and an Akasol® PTL 3-38/75 film layer. The melting point for the poly(ethylene-co-n-butyl acrylate-co-methacrylic acid) and the poly(ethylene-co-methacrylic acid) copolymer was determined as 75.2° C. and 87° C., respectively, by differential scanning calorimetry. The pre-lamination assembly was then laminated within a Meier laminator. The lamination cycle included an evacuation step (vacuum of 1 mbar) of 4.5 minutes, a pressure build up stage of 1 minute and a pressing stage (pressure of 999 mbar) of 5.5 minutes at a temperature of 140° C.

The 180° peel strengths between the multilayer sheet layer and the glass layer were determined as 33.44 lb-f/in (5.9 N/mm) and 31.21 lb-f/in (5.5 N/mm) for the two samples, respectively.

Two laminate samples were kept in an environment of 85° C. and 85% relative humidity for 840 hours prior to the 180° peel strength testing between the multilayer sheet layer and the glass layer, which were determined as 28.72 lb-f/in (5 N/mm) and 27.34 lb-f/in (4.8 N/mm), respectively.

Examples E9-20

A series of 12×12 in (305×305 mm) laminate structures described below in Table 2 are assembled and laminated by Lamination Process 1, above. For all Examples E9-20 an acid terpolymer surface of the interlayer is in contact with the tin side of the glass sheet. For Examples 15 and 19, the coated surface of the poly(ethylene terephthalate) film is in contact with the acid terpolymer interlayer.

TABLE 2

Laminate Structures

| Example | Layer 1 | Layer 2 | Layer 3 | Layer 4 | Layer 5 |
|---|---|---|---|---|---|
| E9, 21 | Glass 1 | ATR 1 | Glass 1 | | |
| E10, 22 | Glass 2 | ATR 1 | PET 1 | | |
| E11, 23 | Glass 1 | ATR 2 | Glass 1 | | |
| E12, 24 | Glass 3 | ATR 2 | PET 1 | | |
| E13, 25 | Glass 1 | ATR 3 | PET 2 | ATR 3 | Glass 1 |
| E14, 26 | Glass 1 | ATR 4 | Glass 1 | | |
| E15, 27 | Glass 2 | ATR 4 | PET 3 | | |
| E16, 28 | Glass 3 | ATR 5 | PET 4 | ATR 5 | Glass 1 |
| E17, 29 | Glass 1 | ATR 6 | PET 5 | PVB A | Glass 1 |
| E18, 30 | Glass 1 | ATR 7 | ION 1 | ATR 7 | Glass 1 |
| E19, 31 | Glass 2 | ATR 8 | ION 2 | ATR 8 | PET 6 |
| E20, 32 | Glass 1 | ATR 9 | ION 2 | ATR 8 | Glass 1 |

Examples E21-32

A series of 12×12 in (305×305 mm) laminate structures described above in Table 2 are assembled and laminated by Lamination Process 2. For all Examples E21-32 an acid terpolymer surface of the interlayer is in contact with the tin side of the glass sheet. For Examples E27 and E31, the coated surface of the PET film is in contact with the acid terpolymer interlayer.

Examples E33-46

A series of 12×12 in (305×305 mm) solar cell laminate structures described below in Table 3 are assembled and laminated by Lamination Process 1. Layers 1 and 2 constitute the incident layer and the front encapsulant layer, respectively, and Layers 4 and 5 constitute the back encapsulant layer and the backing layer, respectively.

TABLE 3

Laminate Structures

| Example | Layer 1 | Layer 2 | Layer 3 | Layer 4 | Layer 5 |
|---|---|---|---|---|---|
| E33, 47 | Glass 4 | ATR 3 | Solar Cell 1 | ATR 3 | FPF |
| E34, 48 | Glass 4 | ATR 3 | Solar Cell 2 | ATR 1 | Glass 1 |
| E35, 49 | Glass 4 | ATR 5 | Solar Cell 3 | ATR 5 | TPT |
| E36, 50 | Glass 4 | ATR 5 | Solar Cell 4 | ATR 2 | Glass 1 |
| E37, 51 | FPF | ATR 6 | Solar Cell 1 | ATR 6 | AL |
| E38, 52 | Glass 4 | EVA | Solar Cell 2 | ATR 4 | Glass 1 |
| E39, 53 | FPF | ATR 10 | Solar Cell 1 | ATR 10 | FPF |
| E40, 54 | Glass 1 | ATR 10 | Solar Cell 2 | PVB | PET 1 |
| E41, 55 | Glass 4 | ATR 11 | Solar Cell 3 | ATR 11 | TPT |
| E42, 56 | Glass 4 | ATR 11 | Solar Cell 4 | ION 2 | AL |
| E43, 57 | Glass 4 | ION 3 | Solar Cell 1 | ATR 11 | Glass 1 |

TABLE 3-continued

Laminate Structures

| Example | Layer 1 | Layer 2 | Layer 3 | Layer 4 | Layer 5 |
|---|---|---|---|---|---|
| E44, 58 | Glass 4 | ATR 12 | Solar Cell 2 | ATR 12 | FPF |
| E45, 59 | Glass 4 | ATR 12 | Solar Cell 1 | PVB-A | Glass 1 |
| E46, 60 | Glass 4 | ATR 12 | Solar Cell 4 | ION 1 | |

Examples E47-60

A series of 12×12 in (305×305 mm) solar cell laminate structures described above in Table 3 are assembled and laminated by Lamination Process 2. Layers 1 and 2 constitute the incident layer and the front encapsulant layer, respectively, and Layers 4 and 5 constitute the back encapsulant layer and the backing layer, respectively.

The invention claimed is:

1. A multilayer film or sheet having a total thickness of about 2 mils to about 20 mils comprising a first surface sub-layer, a second surface sub-layer, and one or more inner sub-layers sandwiched between the first and second surface sub-layers, wherein
   (a) the first surface sub-layer and the second surface sub-layer each have a thickness of about 0.5 mils to about 3 mils and consist essentially of a non-neutralized acid terpolymer;
   (b) the one or more inner sub-layer(s) has a thickness of about 0.5 mils to about 20 mils and comprises an ionomer having a melting point of at least about 90° C., said ionomer derived from an acid copolymer that comprises repeat units derived from ethylene and an $\alpha,\beta$-ethylenically unsaturated carboxylic acid selected from the group consisting of acrylic acid and methacrylic acid; and
   (c) the acid terpolymer comprises repeat units derived from ethylene, about 7 to about 11 wt % of repeat units derived from an $\alpha,\beta$-ethylenically unsaturated carboxylic acid selected from the group consisting of acrylic acid and methacrylic acid, and about 20 to about 30 wt % of repeat units derived from alkyl ester of acrylic acid or methacylic acid, based on the total weight of the terpolymer; and further wherein, in a laminate comprising said multilayer film or sheet bonded to a glass layer, said multilayer film or sheet does not delaminate from the glass layer after exposure to a temperature of about 75° C. or higher and a relative humidity of about 85% or higher for a period of about 750 hours or longer.

2. The film or sheet of claim 1, wherein the alkyl ester is selected from the group consisting of methyl acrylate, methyl methacrylate, ethyl acrylate, ethyl methacrylate, isopropyl acrylate, isopropyl methacrylate, butyl acrylate, butyl methacrylate, and mixtures of two or more thereof.

3. The film or sheet of claim 1, wherein the alkyl ester is selected from methyl acrylate and butyl acrylate.

4. The film or sheet of claim 3, wherein the ionomer is neutralized to a level of 10% to 40% with a meta ion selected from sodium, zinc, magnesium, and lithium.

5. An article comprising at least one layer of the multilayer film or sheet of claim 1.

6. The film or sheet of claim 1, (a) wherein in the acid terpolymer the alkyl ester is selected from methyl acrylate and butyl acrylate; and (b) wherein the ionomer is neutralized to a level of 10% to 40% with a metal ion selected from sodium, zinc, magnesium, and lithium.

7. A safety laminate, comprising:
(a) a multilayer film or sheet comprising a first surface sub-layer, a second surface sub-layer, and one or more inner sub-layers sandwiched between the first and second surface sub-layers, wherein:
  (i) the first surface sub-layer and the second surface sub-layer consist essentially of a non-neutralized acid terpolymer;
  (ii) at least one of the inner sub-layer(s) comprise(s) a high melting point polymer;
  (iii) the acid terpolymer comprises repeat units derived from ethylene, about 7 to about 11 wt % of repeat units derived from and α,β-ethylenically unsaturated carboxylic acid selected from the group consisting of acrylic acid and methacrylic acid, and about 20 to about 30 wt % of repeat units derived from an alkyl ester of acrylic acid or methacrylic acid, based on the total weight of the terpolymer; and
  (iv) the high melting point polymer is an ionomer having a melting point of at least about 90° C., said ionomer derived from an acid copolymer that comprises repeat units derived from ethylene and an α,β-ethylenically unsaturated carboxylic acid selected from the group consisting of acrylic acid and methacrylic acid; and
(b) at least one outer laminate layer comprising or formed of a rigid sheet or polymeric film, wherein:
  (i) the rigid sheet is selected from the group consisting of glass and rigid polymeric sheets formed of polycarbonates, acrylics, polyacrylates, cyclic polyolefins, polystyrenes, polyamides, polyesters, fluoropolymers, or combinations of two or more thereof; and
  (ii) the polymeric film comprises a polymeric material selected from the group consisting of polyesters, poly(ethylene naphthalate), polycarbonate, polyolefins, norbornene polymers, polystyrene, styrene-acrylate copolymers, acrylonitrile-styrene copolymers, polysulfones, nylons, polyurethanes, acrylics, cellulose acetates, cellophane, poly(vinyl chlorides), fluoropolymers, and combinations of two or more thereof;
and further wherein, in a laminate comprising said multilayer film or sheet bonded to a glass layer, said multilayer film or sheet does not delaminate from the glass layer after exposure to a temperature of about 75° C. or higher and a relative humidity of about 85% or higher for a period of about 750 hours or longer.

8. The safety laminate of claim 7, wherein the safety are comprises two outer laminate layers and an interlayer that is sandwiched between the two outer laminate layers; wherein each of the two outer laminate layers independently comprises or is formed of the rigid sheet or the polymeric film; wherein the interlayer is the multilayer film or sheet and optionally other polymeric film(s) or sheet(s); and wherein the multilayer film or sheet has a thickness of about 10 mils to about 250 mils.

9. The safety laminate of claim 7, wherein the multilayer film or sheet has a thickness of about 15 mils to about 90 mils and is sandwiched between two glass sheets.

10. The safety laminate of claim 7, wherein the multilayer film or sheet of claim 1 has a thickness of about 15 mils to about 90 mils and is sandwiched between a glass sheet and a polyester film, and wherein the polyester film is optionally hardcoated on the outside surface.

11. The safety laminate of claim 7, wherein the alkyl ester is selected from methyl acrylate and butyl acrylate.

12. A solar cell pre-laminate assembly, comprising
(a) a multilayer film or sheet comprising a first surface sub-layer, a second surface sub-layer, and one or more inner sub-layers sandwiched between the first and second surface sub-layers, wherein:
  (i) the first surface sub-layer and the second surface sub-layer consist essentially of a non-neutralized acid terpolymer;
  (ii) at least one of the inner sub-layer(s) comprises an ionomer having a melting point of at least about 90° C., said ionomer derived from an acid copolymer that comprises repeat units derived from ethylene and an α,β-ethylenically unsaturated carboxylic acid selected from the group consisting of acrylic acid and methacrylic acid; and
  (iii) the acid terpolymer comprises repeat units derived from ethylene, about 7 to about 11 wt % of repeat units derived from and α,β-ethylenically unsaturated carboxylic acid selected from the group consisting of acrylic acid and methacrylic acid, and about 20 to about 30 wt % of repeat units derived from an alkyl ester of acrylic acid or methacrylic acid, based on the total weight of the terpolymer; and
(b) a solar cell component formed of one or a plurality of electronically interconnected solar cells;
and further wherein, in a laminate comprising said multilayer film or sheet bonded to a glass layer, said multilayer film or sheet does not delaminate from the glass layer after exposure to a temperature of about 75° C. or higher and a relative humidity of about 85% or higher for a period of about 750 hours or longer.

13. The solar cell pre-laminate assembly of claim 12, wherein the solar cell is selected from the group consisting of multi-crystalline solar cells, thin film solar cells, compound semiconductor solar cells, amorphous silicon solar cells, and combinations of two or more.

14. The solar cell pre-laminate assembly of claim 12, consisting essentially of, from top to bottom, (i) and incident layer that is positioned next to, (ii) a front encapsulant layer that is positioned next to, (iii) the solar cell component that is positioned next to, (iv) a back encapsulant layer that is positioned next to, (v) a backing layer, wherein one or both of the two encapsulant layers are formed of the non-neutralized acid terpolymer containing multilayer film or sheet.

15. The solar cell pre-laminate assembly of claim 12, which comprises a front encapsulant layer positioned next to the light-receiving side of the solar cell component and a back encapsulant layer positioned to the back side of the solar cell component, wherein the front encapsulant layer is formed of the multilayer film or sheet having a thickness of about 2 mils to about 20 mils; and wherein the back encapsulant layer is formed of a polymeric material selected from the group consisting of acid copolymers, ionomers, ethylene vinyl acetates, poly(vinyl acetals) (including acoustic grade poly(vinyl acetals), polyurethanes, polyvinylchlorides, polyethylenes, (e.g., linear low density polyethylenes), polyolefin block elastomers, poly(α-olefin-co-α,β-ethylenically unsaturated carboxylic acid ester) copolymers (e.g., poly(ethylene-co-methyl acrylate) and poly(ethylene-co-butyl acrylate)), silicone elastomers, epoxy resins, and combinations thereof.

16. The solar cell re-laminate assembly of claim 15, wherein the alkyl ester is selected from methyl acrylate and butyl acrylate.

17. The solar cell pre-laminate assembly of claim 15, wherein the front encapsulant layer and the back encapsulant layer comprise or are formed of the multilayer films or sheet.

18. The solar cell pre-laminate assembly of claim 15, further comprising an incident layer positioned next to, the front encapsulant layer and a backing layer positioned to the back encapsulant layer.

19. The solar cell pre-laminate assembly of claim 18, wherein the incident layer is selected from the group consisting of (i) glass sheets, (ii) polymeric sheets formed of polycarbonates, acrylics, polyacrylates, cyclic polyolefins, polystyrenes, polyamides, polyesters, fluoropolymers, or combinations thereof, and (iii) polymeric films formed of polyesters, poly(ethylene naphthalate), polycarbonate, polyolefins, norbornene polymers, polystyrene, styrene-acrylate copolymers, acrylonitrile-styrene copolymers, polysulfones, nylons, polyurethanes, acrylics, cellulose acetates, cellophane, poly(vinyl chlorides), fluoropolymers, or combinations thereof.

20. The cell pre-laminate assembly of claim 18, wherein the backing layer comprises or is formed of (i) glass sheet, (ii) polymeric sheet, (iii) polymeric film, (iv) metal sheet, and (V) ceramic plate; the polymeric sheet comprises or is formed of polycarbonates, acrylics, polyacrylates, cyclic polyolefins, polystyrenes, polyamides, polyesters, fluoropolymers, or combinations thereof; and the polymeric film comprises or is formed of a polymeric material selected from the group consisting of polyesters, poly(ethylene naphthalate), polycarbonate, polyolefins, norbornene polymers, polystyrene, styrene-acrylate copolymers, acrylonitrile-styrene copolymers, polysulfones, nylons, polyurethanes, acrylics, cellulose acetates, cellophane, poly(vinyl chlorides), fluoropolymers, or combinations thereof.

21. A process comprising: (i) providing a solar cell pre-lamination assembly and (ii) laminating the assembly to form the solar cell module, wherein the assembly is as recited in claim 12.

22. The process of claim 21, wherein the laminating step is conducted by subjecting the assembly to heat.

23. A multilayer film or sheet having a total thickness of about 2 mils to about 20 mils consisting essentially of a first surface sub-layer, a second surface sub-layer, and one inner sub-layer sandwiched between the first and second surface sub-layers, wherein the first surface sub-layer and the second surface sub-layer each have a thickness of about 0.5 mils to about 3 mils and consists essentially of a non-neutralized acid terpolymer and a silane coupling agent; the inner sub-layer(s) has a thickness of about 0.5 mils to about 20 mils and comprises an ionomer having a melting point of at least about 90° C., said ionomer derived from an acid copolymer that comprises repeat units derived from ethylene and an $\alpha,\beta$-ethylenically unsaturated carboxylic acid selected from the group consisting of acrylic acid and the methacrylic acid; and the acid terpolymer consists essentially of repeat units derived from ethylene, about 7 to about 11 wt % of repeat units derived from an $\alpha,\beta$-ethylenically unsaturated carboxylic acid selected from acrylic acids, methacrylic acids, and mixtures of two or more thereof, and about 20 to about 30 wt % of repeat unite derived from an $\alpha,\beta$-ethylenically unsaturated carboxylic acid ester selected from methyl acrylate and butyl acrylate, based on the total weight of the terpolymer; and further wherein, in a laminate comprising said multilayer film sheet bonded to a glass layer, said multilayer film or sheet does not delaminate from the glass layer after exposure to a temperature of about 75° C. of higher and a relative humidity of about 85% or higher for a period of about 750 hours or longer.

24. An article comprising at least one layer of the multilayer film or sheet of claim 23, wherein the article is a solar cell pre-laminate assembly, further comprising a solar cell component formed of one or a plurality of electronically interconnected solar cells.

25. The film or sheet of claim 23, wherein the ionomer is neutralized to a level of 10% to 40% with a metal ion selected from sodium, zinc, magnesium, and lithium.

26. The film or sheet of claim 23, (a) wherein in the acid terpolymer the alkyl ester is selected from methyl acrylate and butyl acrylate; and (b) wherein the ionomer is neutralized to a level of 10% to 40% with a metal ion selected from sodium, zinc, magnesium, and lithium.

\* \* \* \* \*